United States Patent [19]
Lee

[11] Patent Number: 5,113,097
[45] Date of Patent: May 12, 1992

[54] CMOS LEVEL SHIFTER CIRCUIT

[75] Inventor: Sywe N. Lee, Lawrenceville, N.J.

[73] Assignee: David Sarnoff Research Center, Inc., Princeton, N.J.

[21] Appl. No.: 696,981

[22] Filed: May 2, 1991

Related U.S. Application Data

[63] Continuation of Ser. No. 470,274, Jan. 25, 1990, abandoned.

[51] Int. Cl.[5] ................. H03K 19/0175; H03K 19/20
[52] U.S. Cl. .................................... 307/475; 307/451; 357/23.7
[58] Field of Search ............... 307/475, 448, 451, 584, 307/585, 298; 357/23.7

[56] References Cited

U.S. PATENT DOCUMENTS

| | | | |
|---|---|---|---|
| 4,618,785 | 10/1986 | Van Tran | 307/530 |
| 4,633,192 | 12/1986 | Anami | 330/277 |
| 4,779,015 | 10/1988 | Erdelyi | 307/475 |
| 4,786,830 | 11/1988 | Foss | 307/264 |
| 4,929,853 | 5/1990 | Kim et al. | 307/475 |

OTHER PUBLICATIONS

Digital Integrated Electronics, Herbert Haub and Donald Schilling, pp. 39-41, 1977.

Primary Examiner—David Hudspeth
Assistant Examiner—Andrew Sanders
Attorney, Agent, or Firm—W. J. Burke

[57] ABSTRACT

A level shifter circuit has a pair of voltage buses, first and second p-channel MOS transistors and third and fourth n-channel MOS transistors. Each transistor has a gate to control conduction. The first and third transistors are connected in series between the voltage buses and the second and fourth transistors are connected in series between the voltage buses. A node between the first and second transistors is connected to the gates of the second and fourth transistors. An input signal having one of first and second levels is applied to the gate of the first transistor while the inverse of the input signal is applied to the gate of the second transistor. One voltage bus is connected through one of the second and fourth transistors in response to the first level input signal. The other voltage bus is connected the other of the second and fourth transistors in response to the second level input signal.

10 Claims, 2 Drawing Sheets

CMOS LEVEL SHIFTER CIRCUIT

The invention was made with Governmemt support under Contract No. F33615-88-C-1825 awarded by the Department of the Air Force. The Government has certain rights in the invention.

This is a continuation of application Ser. No. 470,274, filed on Jan. 25, 1990, now abandoned.

FIELD OF THE INVENTION

The invention relates to logic circuits and more particularly to complementary metal oxide semiconductor (CMOS) level shifter circuitry.

BACKGROUND OF THE INVENTION

In many logic, memory and timing arrangements, it is necessary to communicate between functional blocks which require different drive voltages. Voltage level shifters provide interfaces where the voltage levels available at the output of one block do not meet the voltage level requirements of an interconnected block.

U.S. Pat. No. 4,618,785 (H. van Tran) discloses a CMOS differential sense amplifier which includes n-channel level shifters and a differential sense amplifier. The level shifters use only n-channel transistors and thus lose a threshold voltage when providing an output high (a "1") signal. The sense amplifier uses complementary MOS transistors and can perform a level shifting function. It is unable to provide an output voltage level below the same low voltage level associated with the level shifter which has an output coupled to an input of the differential sense amplifier.

While the design of voltage level shifters is well known in the art, there are often special operating conditions and device characteristics that cause poor operation of known circuits. For example, flat panel displays (e.g., liquid crystal displays) often require special interface circuits to discharge transistors having very large time constants. Where the circuits are formed on a glass panel using thin film techniques, the thin film device (e.g., field effect transistor) characteristics are not as precisely defined as bulk type devices. In such apparatus, the proper operation must be assured over a wide range of conditions and a wide range of device parameters. It is desired to have a voltage level shifter circuit which is adapted to operate with widely varying device characteristics and is suitable for implantation using CMOS thin film transistors on the glass of a liquid crystal display.

SUMMARY OF THE INVENTION

Viewed from one aspect, the invention is directed to voltage level shifting circuitry comprising a first and second p-channel field effect transistors, third and fourth n-channel field effect transistors, and inverting means. Each of the transistors has a gate and a first output. The inverting means has an input coupled to a circuitry input terminal and to the gate of the first transistor, and has an output coupled to the gate of the second transistor. A circuitry output terminal is coupled to the first outputs of the second and fourth transistors. The first outputs of the first and third transistors are coupled to the gates of the third and fourth transistors.

In a typical embodiment second outputs of the first and second transistors are coupled to a positive voltage source (e.g., +15 volts) and second outputs of the third and fourth transistors are coupled to a negative voltage source (e.g., −5 volts). The inverting means is an inverter having supply voltage terminals coupled between +15 volts and 0 volts. Input signal voltage levels applied to the circuitry input terminal have logical "1" (high) and "0" (low) voltage levels of +15 volts and 0 volts, respectively. Voltages generated at the circuitry output terminal have logical "1" and "0" voltage levels of +15 volts and −5 volts, respectively.

The level shifting circuitry of the present invention is able to fully function within acceptable ranges even in view of variations in threshold voltages which exist with metal-oxide-semiconductor (MOS) transistors fabricated on a glass plane (e.g., a liquid crystal display) using thin film techniques.

Viewed from another aspect, the invention is directed to a level shifter circuit comprising a pair of voltage buses, first and second MOS transistors of one conductivity type and third and fourth MOS transistors of the opposite conductivity type. Each transistor has a gate to control conduction. The first and third transistors are connected in series between the voltage buses and the second and fourth transistors are connected in series between the voltage buses. A node between the first and second transistors is connected to the gates of the second and fourth transistors. An input signal having one of first and second levels is applied to the gate of the first transistor and the inverse of the input signal is applied to the gate of the third transistor. A node between the second and fourth transistors is coupled to one of the voltage buses through one of the second and fourth transistors in response to the first level input signal and is connected to the other of the voltage buses through the other of the second and fourth transistors in response to the second level input signal.

The invention will be better understood from the following more detailed description taken with the accompanying drawings and claims.

DETAILED DESCRIPTION

Figure 1:
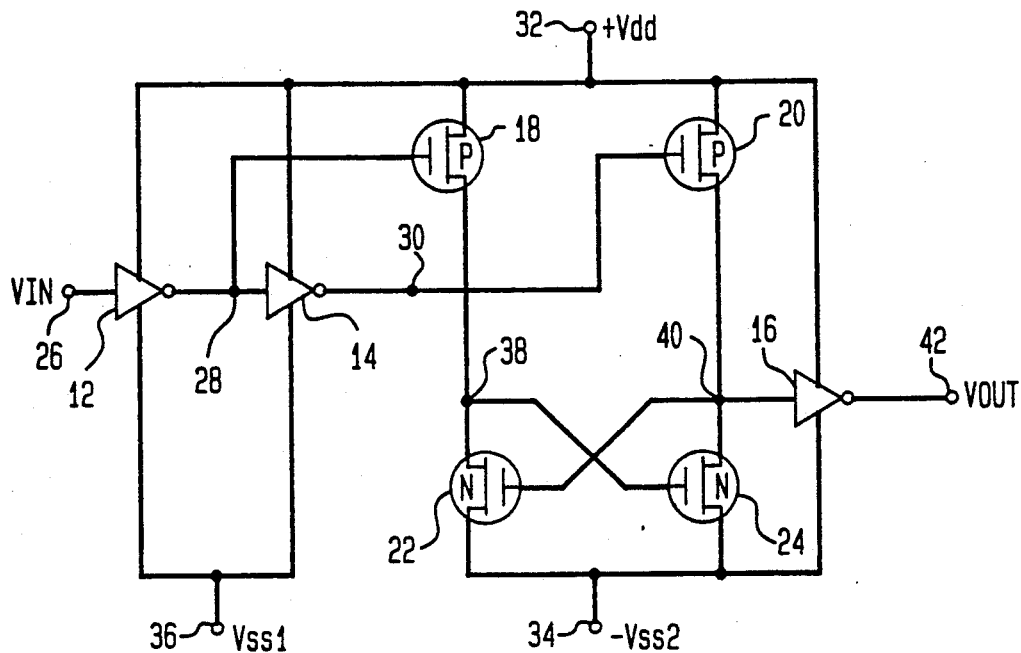
FIG. 1 is a schematic and block diagram of a level shifter circuit in accordance with the prior art.

Referring to FIG. 1, there is shown a prior art level shifter circuit 10. The level shifter circuit 10 comprises an input terminal (VIN) 26, supply voltage terminals 32, 34 and 36, an output terminal (VOUT) 42, inverters 12, 14 and 16, p-channel MOS transistors 18 and 20, and n-channel MOS transistors 22 and 24. The input terminal 26 is connected to an input of inverter 12. An output of inverter 12 is connected through a node 28 to an input of inverter 14 and to a gate of the p-channel MOS transistor 18. The output of inverter 14 is connected to a gate of p-channel MOS transistor 20 via a node 30. Sources of p-channel transistors 18 and 20 and first supply voltage terminals of inverters 12, 14 and 16 are connected to a positive voltage source +Vdd at the supply voltage terminal 32. The drains of transistors 22 and 24 and second supply voltage terminals of inverter 16 are connected to a negative voltage source −Vss2 and to a supply voltage terminal 34. Second supply terminals of inverters 12 and 14 are coupled to a reference voltage source Vss1 and to a supply voltage terminal 36. A drain of transistor 18 is connected via a node 38 to a drain of transistor 22 and to the gate of transistor 24. A drain of transistor 20 is connected through a node 40 to a drain of transistor 24 and to an input of inverter 16. An output of inverter 16 is connected to output terminal (VOUT) 42.

Typically a binary signal having logical zero (a low, a "0") and logical one (a high, a "1") states is applied to VIN (terminal 26). The positive supply voltage +Vdd at terminal 32 is, for example, +15 volts. The negative supply voltage −Vss2 at terminal 34, is, for example, −5 volts. The reference supply voltage Vss1 at terminal 36 is, for example, "0" (ground) volts. Input signals applied to terminal 26 have a high ("1") level of +15 volts and a low ("0") level of zero (ground) volts. Accordingly, the input signal applied to terminal 26 has logic levels of 0 volts and +15 volts. An inverter, as is well known in the art, produces a logical one in response to a logical zero at its input and a logical zero in response to a logical one at its input. Inverters 12 and 14 are connected between +15 volts and Vss1 which is, for example, zero volts (ground). Consequently, the "0" from the inverters 12 and 14 has a zero volt level and a "1" from the inverters 12 and 14 has a +15 volt level. Inverter 16 is connected between supply voltages +Vdd and −Vss2. A "0" from inverter 16 has a −Vss2 voltage level and a "1" therefrom has a +Vdd voltage level.

When the voltage level applied to terminal 26 is zero volts, an input "0" level, node 28 at the output of inverter 12 shifts to a "1", e.g. +15 volts. The input of inverter 14 and the gate transistor 18 are at the "1" level of +15 volts. Inverter 14 generates a "0" at node 30 which enables (biases on) transistor 20. Current flow through transistor 20 causes node 40 to be pulled up (raised) in voltage towards +Vdd. Transistor 18 is disabled (biased off, turned off) by the "1" level at its gate (node 28) and is non-conductive. As node 40 charges towards +Vdd, transistor 22 becomes enabled and causes node 38 to discharge towards −Vss2. This disables transistor 24 which then allows the voltage of node 40 to continue to rise and to reach a voltage level of +Vdd. Since the voltage of node 40 is a "1" (+15 volts) at this time, the output voltage of circuit 10 at terminal 42 is a "0" (−Vss2 which is −5 volts).

When an input "1" is applied to terminal 26, node 28 is a "0" and transistor 18 is enabled and conducts. The voltage at output of inverter 14 at node 30 and the gate of transistor 20 is a "1" which disables (turns off, biases off) transistor 20. As transistor 18 conducts, it charges node 38 towards +Vdd which enables transistor 24 which begins to conduct. Conduction through transistor 24 causes node 40 to be pulled down (discharged) in voltage to −Vss2. A voltage of −Vss2 on node 40 disables transistor 22. This allows enabled transistor 18 to continue to charge node 38 to +Vdd which keeps transistor 24 enabled. The resulting −Vss2 voltage on node 40 is inverted by inverter 16 and results in an output "1" (a voltage of +Vdd) on terminal 42.

Circuit 10 of FIG. 1 provides the desired level shift as long as the transistor characteristics adequately meet the requirements of the circuit. In some situations, however, transistors with relatively poor characteristics must be used and the level shifter circuit 10 may not function. For example, thin film field effect transistors (e.g., MOS transistors) on glass substrates (e.g., liquid crystal displays) may be required in optical display and sensing apparatus. Such transistors exhibit poor characteristics that may impair the operation of the circuit of FIG. 1. Consider the operation of level shifter 10 when the threshold voltage of p-channel transistor 18 is much higher than the threshold of n-channel transistor 22. If the applied input voltage at input terminal 26 changes from zero volts to +15 volts when node 38 is at −Vss2 and node 40 is at +Vdd, transistor 20 is turned off by the high voltage level at node 30. If the threshold of p-channel transistor 18 is much higher than the threshold of n-channel transistor 22, the drain-source resistance of the p-channel transistor 18 may be much larger than that of drain-source resistance of the n-channel transistor 22 when both are enabled and conducting. Consequently, p-channel transistor 18 cannot raise (pull up) the voltage at node 38 sufficiently positive to cause n-channel transistor 24 to become enabled and turn on. This leaves node 40 at essentially +15 volts and thus the output at terminal 42 is at −Vss2 (−5 volts). Consequently, the circuit 10, which should have an output voltage level of +Vdd when +Vdd is applied to the input, can have an output level of −Vss2 and thus fails to function as a level shifter.

Figure 2:
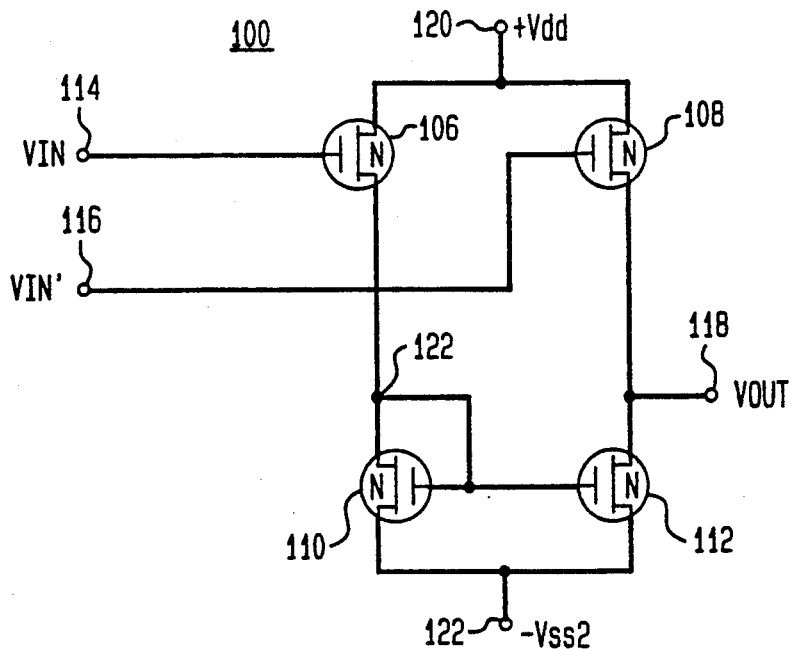
FIG. 2 is a schematic and block diagram of another level shifter circuit in accordance with the prior art.

Referring to FIG. 2, there is shown another prior art level shifter circuit 100. Level shifter 100 comprises n-channel MOS transistors 106, 108, 110 and 112. Each of the transistors has a gate, a drain and a source. A first input terminal VIN is coupled to the gate of transistor 106 and to a terminal 114. A second input terminal VIN' is coupled to the gate of transistor 108 and to a terminal 116. VIN' receives the logic inverse of a signal applied to VIN. An output terminal VOUT is coupled to the source of transistor 108, to the drain of transistor 112 and to a terminal 118. A first power supply terminal is coupled to the drains of transistors 106 and 108, to a terminal 120 and to a power supply having a voltage +Vdd. The sources of transistors 110 and 112 are coupled together to a terminal 122 and to a power supply having a voltage level −Vss2. Input signal voltage levels of signals applied to VIN and VIN' have a "1" voltage level of +Vdd and a "0" voltage level of Vss1 (not shown), where Vss1 is more positive than −Vss2 and less positive than +Vdd. The source of transistor 106 and the drain of transistor 110 are coupled to the gates of transistors 110 and 112 and to a terminal 122

In one illustrative embodiment of circuit 100, +Vdd=+15 volts, Vss1=0 volts (ground) and Vss2 equals −5 volts. Input signals applied to the input terminals 114 and 116 have a "1" logic level of +15 volts and a "0" logic level of zero volts. A "1" applied to the input terminal 114 enables (biases on) transistor 106 and a current path from +Vdd through transistors 106 and 110 to −Vss2 is created. This sets up a voltage at terminal 122 which enables transistor 112 and causes transistor 112 to conduct and to try and pull down the voltage of terminal 118 (VOUT) to −Vss2. The voltage on terminal 116 at this time is a logical input "0", zero volts. This weakly enables transistor 108 since its gate can be a negative in voltage as much as −Vss2. Thus transistor 108 tries to pull the voltage of terminal 118 towards +Vdd. Accordingly, with transistor 112 being strongly biased on and transistor 108 being weakly biased on, the voltage of the output terminal 118 is typically close to −Vss2, an output logical "0".

An input "0" (zero volts) applied to input (VIN) terminal 114 causes transistor 106 to be weakly biased on and thus establishes an current flow from +Vdd through transistors 106 and 110 to −Vss2. This weakly biases on transistor 112 which then tries to pull the voltage of output terminal 118 to −Vss2. At this same time transistor 108 is strongly biased on by a input "1" applied to terminal 116. Accordingly, a current path is established from +Vdd through transistors 108 and 112. Since transistor 108 is strongly biased on, the resulting voltage at output terminal 118 is close to +Vdd, an output logical "1". The maximum level of an output logical "1" is +Vdd less the threshold voltage of transistor 108. Accordingly, the difference between the output voltage logic levels of circuit 100 can be less than the difference between +Vdd and −Vss2.

Figure 3:
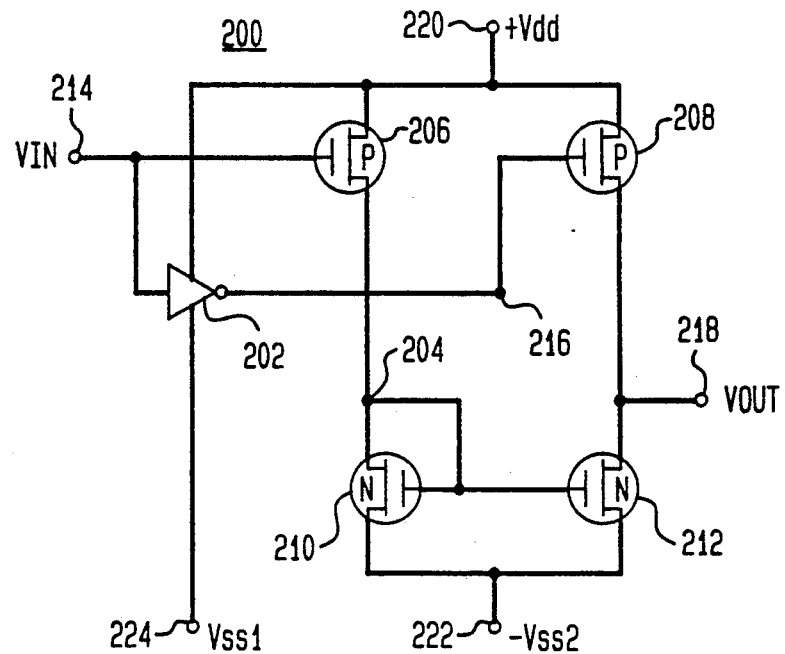
FIG. 3 is a schematic and block diagram of a level shifter circuit in accordance with an embodiment of the invention.

Referring now to FIG. 3, there is shown a level shifter circuit 200 in accordance with the invention. Level shifter circuit 200 comprises p-channel field effect transistors 206 and 208, n-channel field effect transistors 210 and 212, and an inverter 202. Each of the transistors is typically an MOS transistor and has a gate, a drain and a source. An input terminal (VIN) is coupled to an input of inverter 202, to the gate of transistor 206 and to a terminal 214. An output terminal (VOUT) is coupled to the drains of transistors 208 and 212 and to a terminal 218. A first power supply terminal of inverter 202 is coupled to the sources of transistors 206 and 208, to a terminal 220 and to a power supply having a voltage level of +Vdd. A second power supply terminal of inverter 202 is coupled to a terminal 224 and to power supply having a voltage level of Vss1. The sources of transistors 210 and 212 are coupled together to a terminal 222 and to a power supply having a voltage level −Vss2, where Vss1 is less positive than +Vdd and is more positive than −Vss2. An output of inverter 202 is coupled to the gate of transistor 208 and to a terminal 216. The drains of transistors 206 and 210 are coupled to the gates of transistors 210 and 212 and to a terminal 204.

In one embodiment of circuit 200, +Vdd = +15 volts, Vss1 = zero volts (ground) and −Vss2 equals −5 volts. Input signals applied to the VIN terminal have a "1" logic level of +15 volts and a "0" logic level of zero volts. A logical input "1" applied to input terminal 214 disables (biases off) transistor 206. This causes transistor 210 to be disabled and no current to flow there through. This disables transistor 212. The output (terminal 216) of inverter 202 is a logical input "0" (zero volts) which enables transistor 208. Thus output terminal (VOUT) 218 is pulled all the way up to the voltage of +Vdd (+15 volts), an output logical "1".

If the input signal applied to input terminal (VIN) 214 is an input "0" (zero volts, Vss1), then transistor 206 is enabled and transistor 208 is disabled. This results in a current path from +Vdd through transistors 206 and 210 which sets up a voltage on terminal 204 that enables transistor 212 which then conducts. The initial current flow through enabled transistor 212, which comes from a parasitic capacitance or load capacitance (both not shown) coupled to terminal 218, is essentially the same as is flowing through transistors 206 and 210. Thus output terminal (VOUT) 218 discharges through enabled transistor 212 all the way down to the voltage level of −Vss2 (−5 volts), an output logical "0" level. Transistor 212 stops conducting when terminal 218 reaches −Vss2. Accordingly, input signals with logic levels of 0 to +15 volts are level shifted by circuit 200 and become output signal levels of −5 volts and +15 volts, respectively. Thus the output signal levels have a potential difference equal to the full difference between +Vdd and −Vss2.

In contrast to the level shifter circuit 10 of FIG. 1, the level shifter circuit 200 of FIG. 3 does not depend on the matching of the threshold voltages of p-channel and n-channel transistors. Consequently, the circuit operation of level shifter circuit 200 is independent of differences in device thresholds that may occur when transistors having poor characteristics are used.

Figure 4:
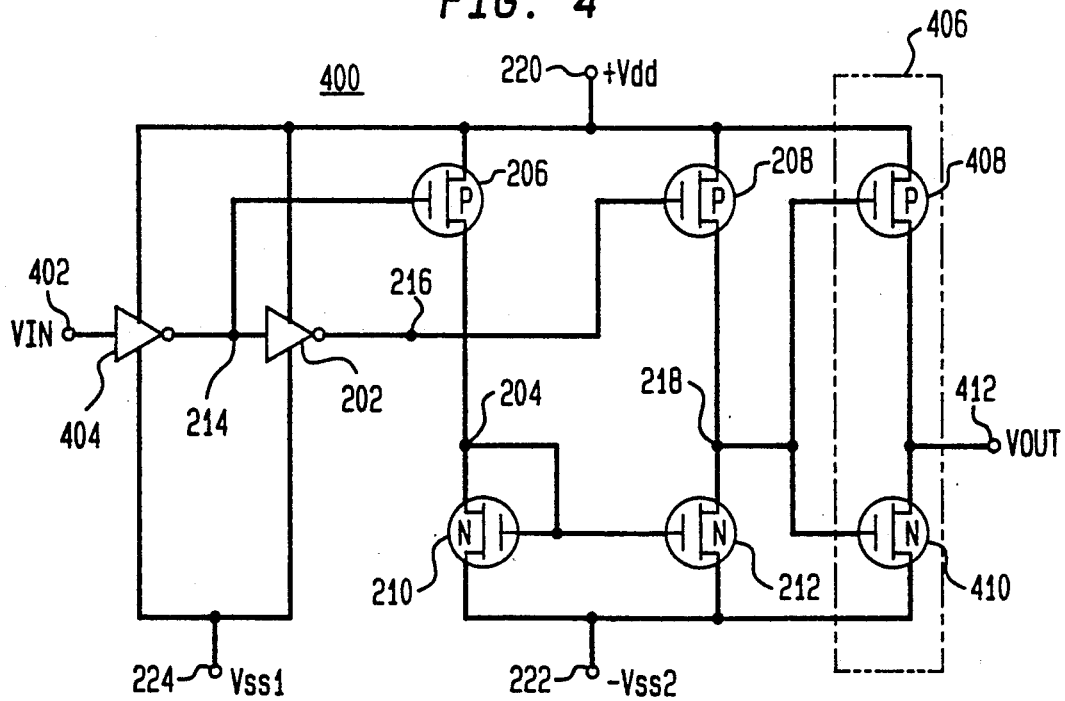
FIG. 4 is a schematic and block diagram of a level shifter circuit in accordance with another embodiment of the invention.

Referring now to FIG. 4, there is shown a level shifter circuit 400 in accordance with the invention. Level shifter circuit 400 is essentially the same as level shifter circuit 300 of FIG. 3 except for the addition of a second input inverter 404 and an output buffer inverter 406 (shown within a dashed line rectangle). All components and terminals of inverter circuit 400 which are the same as the corresponding components and terminals of inverter circuit 200 of FIG. 3 have the same reference numbers.

Buffer inverter 406 comprises a p-channel transistor 408 and an n-channel transistor 410. Gates of transistors 408 and 410 are coupled to the terminal 218. Sources of transistors 408 and 410 are coupled to power supply terminals 220 and 222, respectively. Drains of transistors 408 and 410 are coupled to a terminal 412 which serves as an output (VOUT) of inverter circuit 400. Buffer inverter 406 is used to provide increased current drive capability to level shifter circuit 400. Since it introduces an inversion in the output signal generated at terminal 412, an additional inversion, which is provided by the inverter 404, is needed so as to generate essentially the same output signal waveform as is generated by circuit 300 of FIG. 3. Inverter 404 has an input coupled to the inverter circuit 400 input terminal 402 and has an output coupled to an input of the inverter 202 and to the terminal 214.

Inverters 404 and 202 each typically comprise a CMOS inverting stage having the same form as inverter 406.

It is to be understood that the specific embodiments described herein are intended merely to be illustrative of the spirit and scope of the invention. Modifications can readily be made by those skilled in the art consistent with the principles of this invention.

What is claimed is:

1. Voltage level shifting circuitry comprising:
   first and second p-channel field effect transistors with each having a gate and a first output;
   third and fourth n-channel field effect transistors with each having a gate and a first output;
   a circuitry input terminal being coupled to the gate of the first transistor;
   a circuitry output terminal being coupled to the first outputs of the second and fourth transistors;
   inverting means having an input coupled to the circuitry input terminal and having an output coupled to the gate of the second transistor for inverting a signal applied to the input thereof; and
   the first output of the first transistor being coupled to the first output of the third transistor and to the gates of the third and fourth transistors;
   each of the field effect transistors being a thin field effect transistor which is formed on a non-semiconductor substrate.

2. The voltage level shifting circuit of claim 1 wherein said inverting means further comprises:
   a first inverter including a fifth p-channel field effect transistor and a sixth p-channel field effect transistor with each of the fifth and sixth transistors having a gate and a first output;

the gates of the fifth and sixth transistors being coupled to the circuitry input terminal; and the first outputs of the fifth and sixth transistors being coupled to said inverting means output.

3. The voltage level shifting circuitry of claim 2 further comprising:

a first power supply terminal coupled to second outputs of the first and second transistors, and a second power supply terminal coupled to second outputs of the third and fourth transistors;

a third power supply terminal; and the fifth and sixth transistors each have a second output with the second output of the fifth transistor being coupled to the first power supply terminal and the second output of the sixth transistor being coupled to the third power supply terminal.

4. The voltage level shifting circuitry of claim 3 wherein:

the first, second, and third power supply terminals are adapted to be coupled to first, second, and third power supplies, respectively; and a voltage of the first power supply is more positive than a voltage of the third power supply which is more positive than a voltage of the second power supply.

5. The voltage level shifting circuitry of claim 4 further comprising:

a second inverter having an input and an output with the input being coupled to the circuitry input terminal and the output being coupled to the input of said first inverter, said second inverter being connected to be supplied power from said first and third power supply terminals; and a third inverter having an input and an output with the input being coupled to first outputs of the second and fourth transistors and the output being coupled to the circuitry output terminal, said third inverter being connected to be supplied power from said first and second terminals.

6. The voltage level shifting circuitry of claim 5 wherein each of the second and third inverters comprises the series combination of a p-channel field effect transistor and an n-channel field effect transistor with drains of the p-channel and n-channel transistors being coupled to an output of the inverter and with gates of a p-channel and an n-channel transistor being coupled together to an input of the inverter.

7. The voltage level shifting circuitry of claim 6 wherein all of the transistors are MOS transistors.

8. A level shifter circuit comprising:

a pair of voltage buses;

first and second p-channel MOS transistors and third and fourth n-channel MOS transistors;

each transistor having a gate to control conduction therethrough;

the first and third transistors being connected in series between the pair of voltage buses;

the second and fourth transistors being connected in series between the pair of voltage buses;

a node between the first and third transistors being connected to the gates of the third and fourth transistors;

means for applying an input signal having one of first and second levels to the gate of the first transistor; and means for applying the inverse of the input signal to the gate of the second transistor; and a node between the second and fourth transistors being coupled to one of the voltage buses through one of the second and fourth transistors in response to the first level signal and to the other of the voltage buses through the other of the second and fourth transistors in response to the second level input signal;

each of the field effect transistors being a thin field effect transistor which is formed on a non-semiconductor substrate.

9. The level shifter circuit of claim 8 wherein during the operation thereof the first level input signal is at essentially a voltage that is more negative than a voltage applied to a first of the voltage buses, and the second level input signal is at a voltage which is more positive than a voltage applied to the second of the voltage buses.

10. A voltage level shifting circuit comprising:

first and second p-channel field effect transistors, each having a gate, a source, and a drain;

third and fourth n-channel field effect transistors, each having a gate, a source, and a drain;

first means for connecting said first and third transistors in series between first and second power supply terminals;

second means for connecting said second and fourth transistors in series between said first and second power supply terminals;

means for applying complementary, binary, logic level, input signals to said gates of said first and second transistors, means for taking an output from said second connecting means between said second and fourth transistors, and means for connecting a circuit node in said first connecting means between said first and third transistors to control voltage at said gates of said third and fourth transistors together;

each of the field effect transistors being a thin field effect transistor which is formed on a non-semiconductor substrate.

* * * * *